United States Patent [19]

Fukutsuka et al.

[11] Patent Number: 4,505,762
[45] Date of Patent: Mar. 19, 1985

[54] METHOD OF PRODUCING COMPOUND-TYPE SUPERCONDUCTING WIRES

[75] Inventors: Toshiro Fukutsuka, Kobe; Masato Moritoki, Miki; Takao Fujikawa, Kobe; Norio Gennai, Nishinomiya, all of Japan

[73] Assignee: Kabushiki Kaisha Kobe Seiko Sho, Kobe, Japan

[21] Appl. No.: 276,984

[22] Filed: Jun. 24, 1981

[30] Foreign Application Priority Data

Jun. 27, 1980 [JP] Japan ................................. 55-88053

[51] Int. Cl.³ ............................................ H01L 39/00
[52] U.S. Cl. ................................ 148/11.5 R; 29/599; 148/11.5 F; 148/11.5 P; 148/127; 148/133
[58] Field of Search ................. 148/4, 11.5 R, 11.5 F, 148/11.5 Q, 11.5 P, 127, 133, 131; 29/599; 75/226

[56] References Cited

U.S. PATENT DOCUMENTS 3,758,347 9/1973 Stalker ..................................... 148/4
3,953,922 5/1976 Heim ..................................... 148/133

OTHER PUBLICATIONS

Bartlett et al., "Stress Effects on Multifilamentary $Nb_3Sn$ Wire", *IEEE Transactions on Magnetics*, vol. Mag-15, No. 1, Jan. 1979, pp. 193-196.

Ekin, "Strain Dependence of the Critical Current and Critical Field in Multifilamentary $Nb_3Sn$ Composites", *IEEE Trans. on Magnetics*, vol. Mag-15, No. 1, Jan. 1979, pp. 197-200.

Easton, et al., "Kirkendall Voids–A Detriment to $Nb_3Sn$ Superconductors" *IEEE Transactions on Magnetics*, vol. Mag-15, No. 1, Jan. 1979, pp. 178-181.

*Primary Examiner*—Peter K. Skiff
*Attorney, Agent, or Firm*—Oblon, Fisher, Spivak, McClelland & Maier

[57] ABSTRACT

A method of producing compound-type superconducting wires which are dense and free of voids. The method comprises the step of holding a compound-type superconducting wire having voids in an atmosphere of sufficiently high temperature high pressure gas to collapse the voids and weld the collapsed areas, thereby forming a dense, void-free superconducting wire.

3 Claims, 6 Drawing Figures

METHOD OF PRODUCING COMPOUND-TYPE SUPERCONDUCTING WIRES

FIELD OF THE INVENTION

The present invention relates to a method of producing compound-type superconducting wires using such a compound as $Nb_3Sn$ and more particularly it relates to a method of producing compound-type superconducting wires which are dense and free of Kirkendall voids which adversely affect the electrical and mechanical properties of the superconducting wires.

BACKGROUND OF THE INVENTION

Generally, compound-type superconducting wires are produced by a method which comprises the steps of making a wire of metallic materials which form a superconductor upon reaction with each other, and heat-treating said wire to form said superconductor.

If said superconductor is in the form of, e.g., $Nb_3Sn$, a composite wire comprising bronze, which is a Cu-Sn alloy, and Nb wires enveloped in said bronze, is produced and then heat-treated to allow the Sn in the bronze and the Nb in the wire to react with each other such that $3Nb+Sn \rightarrow Nb_3Sn$, thereby forming a continuous $Nb_3Sn$ structure in the Cu matrix (bronze process); alternatively, a wire of Cu-Nb alloy is plated with Sn and then heat-treated to produce said reaction (in-situ process). Said composite wire may also be produced by mixing Cu powder with Nb powder, sintering the same, drawing the sintered mass into a wire; the latter is then plated with Sn and heat-treated (powder process). In each of these methods, however, voids, called Kirkendall voids, are inevitably produced in the wire because of a change in the atomic arrangement due to the reaction. The superconducting compound produced in the wire is not fit to be rolled, drawn or otherwise worked. Therefore, the present state is such that after said heat treatment, the product, still containing voids, is used as a superconducting wire without being subjected to any treatment for removal of the voids.

It is well known that the presence of such voids in the superconducting wire lowers the heat conductivity of the wire and is liable to cause damage to the layer of said compound when the wire is stressed, detracting from the electrical properties of the compound-type superconducting wire.

Superconducting compounds are so brittle as not to allow the use of conventional void eliminating means, such as rolling and drawing, as described above. Thus, the presence of such voids in compound-type superconducting wires is a serious problem, and there is an urgent need to develop an effective void eliminating means. In addition, IEEE TRANSACTIONS ON MAGNETICS, VOL. MAG-15, NO. 1, January 1979 carries an article entitled "KIRKENDALL VOIDS—A DETRIMENT TO $Nb_3Sn$ SUPERCONDUCTORS", pp. 178-181, which discloses means for suppressing the formation of Kirkendall voids. ACTA METALLURGICAL, VOL. 23, 1975 carries an article entitled "PRESSURE SINTERING BY POWDER LAW CREEP", pp. 1277-1285, which discloses a mathematical analysis of voids and of sintering.

SUMMARY OF THE INVENTION

In view of the state of the art described above, the present invention is proposed herein with the object of effectively eliminating voids and provides a method of producing dense superconducting wires, characterized in that a superconducting wire obtained by means of heat treatment is held for a given period of time in an atmosphere of sufficiently high temperature high pressure gas to cause plastic deformation of said wire, thereby collapsing said voids and diffusively welding the collapsed areas.

DESCRIPTION OF THE PREFERRED EMBODIMENT

Figures 1A, 1B, 1C:
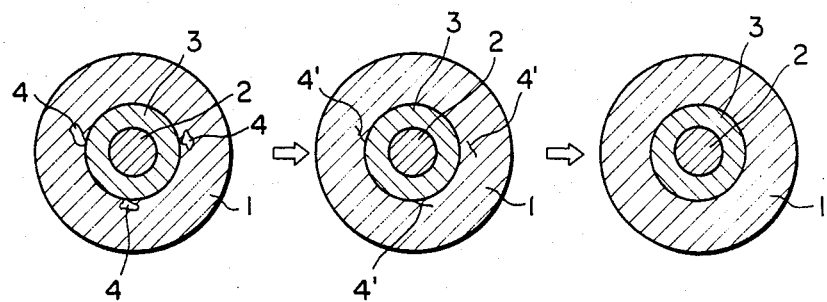
FIG. 1(A), (B) and (C) are schematic views, showing the cross-section of a superconducting wire in the consecutive steps of the method of the present invention.

FIG. 1 schematically shows the cross-section of a superconducting wire, illustrating the concept of the present method. In the case of an $Nb_3Sn$ superconducting wire, an $Nb_3Sn$ superconducting compound 3 is formed, by heat treatment, around a Nb wire 2 enveloped in bronze 1 which serves as a matrix, as shown in FIG. 1(A). At the same time, voids 4 are produced in the matrix 1 in the neighborhood of said compound 3 because of a change in the atomic arrangement brought about by the reaction concomitantly with the formation of $Nb_3Sn$. This superconducting wire is then treated by being held in an atmosphere of high temperature high pressure gas according to the invention. More particularly, in consideration of the fact that the voids are produced in a portion of the matrix in the neighborhood of the compound and that said portion consists mainly of Cu as a result of reaction of Sn in the matrix with Nb, the wire is held in an atmosphere of sufficiently high temperature high pressure gas to cause plastic deformation of the Cu in the matrix, whereby, as shown in FIG. 1(B), the gas pressure acting on the outer surfaces of the wire plastically deforms the matrix 1, changing the voids into crack-like flaws 4'. If the superconducting wire is still held in the high temperature high pressure gas atmosphere, the crack-like flaws are diffusively welded until the voids are completely eliminated to the extent that no trace thereof is visible, as shown in FIG. 1(C).

As described above, the invention causes plastic deformation and diffusive welding exclusively to the void portions of the matrix by simply holding a superconducting wire in a high temperature high pressure gas atmosphere. Therefore, the higher the treating temperature, the lower the gas pressure required for plastic deformation and the shorter the time taken in diffusive welding, so that the treating time is shortened. However, it goes without saying that the temperature employed must be lower than the melting points of the materials used. Further, the higher the pressure, the lower the temperature at which plastic deformation can be produced, but excessively high pressures require the treating apparatus to have a higher resistance to pressure, and take a longer time for pressure boost. Therefore, it is preferable that the pressure be as low as possible.

Where the matrix in which voids are present is Cu or an alloy similar thereto, such as $V_3Ga$, the temperature is preferably above 550° C. but not exceeding the melting point and the pressure is preferably above 200 atmospheres. Particularly where the compound is $Nb_3Sn$, and in consideration of the fact that the heat treating temperature for the required reaction is usually above 650° C., selection of a temperature of above 650° C. for treatment by high temperature high pressure gas enables reaction between Nb and Sn in the unreacted portion to take place side by side with the void eliminating treatment, resulting in an increased proportion of $Nb_3Sn$ area in the superconducting wire, which is expected to contribute to the improvement of the characteristics of the superconducting wire.

As for the gases for forming high temperature high pressure atmospheres, inert gases, which have no adverse effect on the superconducting wire, are preferable, but a small amount of oxygen may be added to inert gases when it is desired to form an insulating oxide film on the superconducting wire.

An example of the invention is given below.

EXAMPLE

Figure 2:
FIG. 2 is a microphotograph of a superconducting wire produced by a conventional method.
Figure 3:
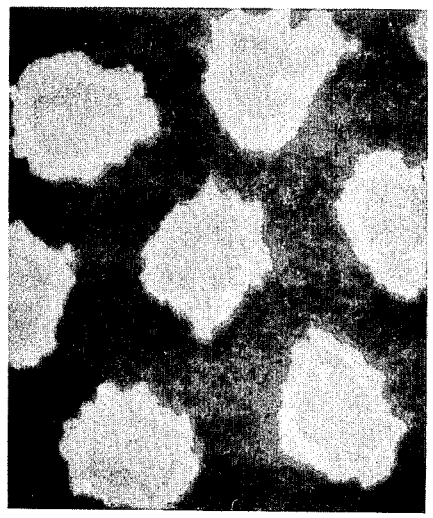
FIG. 3 is a microphotograph of a superconducting wire produced by the present method.

A composite wire material of 0.5 in diameter having a number of Nb wires in a bronze matrix was subjected to a 750° C.×54-hour heat treatment to form a compound phase of $Nb_3Sn$ around the wire strand. As a result, many voids were observed to be present in the matrix, as shown in the microphotograph (magnification: 3,000×) of FIG. 2. The wire material with these voids was treated in an atmosphere of 700° C.×1,000-atmosphere Ar gas for 2 hours. As a result, there was obtained a dense superconducting wire in which the voids had been completely eliminated, as shown in the microphotograph (magnification: 3,000x) of FIG. 3.

Figure 4:
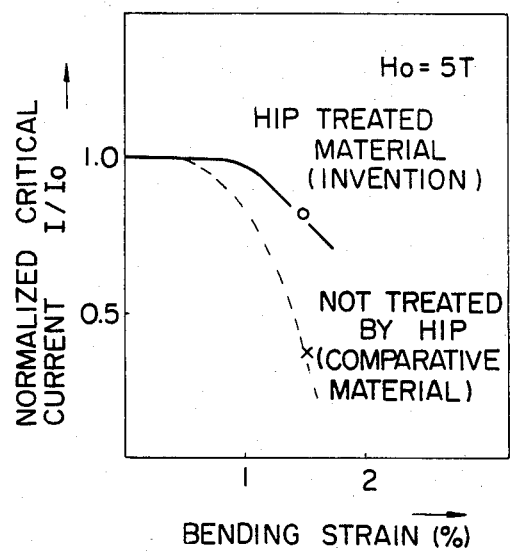
FIG. 4 is a graph showing the results of a test for the effectiveness of the HIP treatment according to the invention in comparison with a control material which has not undergone said HIP treatment.

The dense, void-free superconducting wire thus obtained was tested for its effectiveness and the results shown in FIG. 4 were obtained, it being seen that the ratio of the critical current (Ic) with applied stress to the critical current (Io) at zero stress decreases much less with increasing bending strain in the HIP-treated material than in the untreated material, indicating the superior superconductivity of the HIP-treated material. The testing conditions were as follows.

$Nb_3Sn$ wire HIP Treatment Effectiveness

1. Testpiece
   $Nb_3Sn$ superconducting wire: 1.2 mm in diameter
   HIP treatment: 1,000 kg/cm², 700° C./2 h
2. Bending strain

| Strain: | 0% | 1.5% |
|---|---|---|
| Method of Strain Application: | (1)Diffusion Treatment (30 mm. diam.) | (2)Diffusion Treatment → Rewinding (50 mm. diam.) → (30 mm. diam.) <br> (3)Diffusion Treatment → Rewinding (50 mm. diam.) → (30 mm. diam.) |
| $I_c$ ($A_1$ at 5T) | | |
| (1)0% strain | 1,100 A | |
| (2)1.5% strain | 400 A | |
| (3)HIP treatment (1.5% strain) | 900 A | |

As has been described so far, according to the method of the invention, it is only necessary to hold a superconducting wire having voids in a high temperature high pressure gas atmosphere, thereby collapsing the voids alone and then diffusively welding the collapsed areas in such a manner as to leave no trace of said voids, without causing any damage to the brittle superconducting compound. Thus, the problem that the mechanical and electrical properties of compound-type superconducting wires are deteriorated by the presence of voids has been solved. Further, if the treating temperature of the high temperature high pressure gas is equal to the heat treating temperature for the formation of the compound, the formation of the compound due to the reaction of the unreacted material will proceed, improving the superconducting characteristic. The invention is expected to contribute much to the promotion of practical use and popularization of compound-type superconducting wires.

What is claimed is:

1. A method of producing compound-type superconducting wires having an improved ratio of critical current at applied stress, $I_c$, to critical current at zero stress, $I_o$, which comprises the steps of:
    (i) subjecting a wire made of metallic materials, capable of reacting together, upon heating, to form a compound having superconducting characteristics, to a heat treatment sufficient to form a compound-type wire having superconducting characteristics, and
    (ii) holding said superconducting wire thus formed under sufficient temperature to cause plastic deformation of said wire and sufficient pressure to collapse the voids in said wire, thereby densifying said wire.

2. A method of producing compound-type superconducting wires as set forth in claim 1, wherein the superconducting wire is $Nb_3Sn$ and wherein a wire made of a material which containes Nb and Sn is heat treated to form $Nb_3Sn$.

3. A method of producing compound-type superconducting wires as set forthe in claim 2, wherein the superconducting wire obtained by means of the heat treatment is held in an atmosphere of gas at a temperature above 550° C. and a pressure of above 200 atmospheres.

* * * * *